(12) United States Patent
Roesner et al.

(10) Patent No.: US 9,107,294 B2
(45) Date of Patent: Aug. 11, 2015

(54) SYSTEM INCLUDING A MODULE

(75) Inventors: Arlen L Roesner, Ft. Collins, CO (US); Paul Kessler Rosenberg, Sunnyvale, CA (US); Michael Renne Ty Tan, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 289 days.

(21) Appl. No.: 13/810,665

(22) PCT Filed: Jul. 26, 2010

(86) PCT No.: PCT/US2010/043233
§ 371 (c)(1),
(2), (4) Date: Jan. 16, 2013

(87) PCT Pub. No.: WO2012/015384
PCT Pub. Date: Feb. 2, 2012

(65) Prior Publication Data
US 2013/0114216 A1   May 9, 2013

(51) Int. Cl.
*G02B 6/36* (2006.01)
*H05K 7/02* (2006.01)
*G02B 6/44* (2006.01)
*H05K 5/00* (2006.01)
*G02B 6/38* (2006.01)
*G02B 6/43* (2006.01)
*G02B 6/42* (2006.01)

(52) U.S. Cl.
CPC .............. *H05K 7/02* (2013.01); *G02B 6/4453* (2013.01); *H05K 5/00* (2013.01); *G02B 6/389* (2013.01); *G02B 6/3897* (2013.01); *G02B 6/42* (2013.01); *G02B 6/43* (2013.01)

(58) Field of Classification Search
CPC .......... G02B 6/42; G02B 6/4292; G02B 6/43; G02B 6/389; G02B 6/3897
USPC .................................. 385/14–15, 53, 88–89
See application file for complete search history.

(56) References Cited

U.S. PATENT DOCUMENTS 3,007,131 A * 10/1961 Dahlgren et al. ............. 439/492
4,579,406 A    4/1986 Laursen et al.
4,870,637 A *  9/1989 Follett et al. .................... 398/52

(Continued)

FOREIGN PATENT DOCUMENTS

CN    1292182    4/2001
CN    1629668    6/2005

(Continued)

OTHER PUBLICATIONS

International Searching Authority, International Search Report and Written Opinion, Appln No. PCT/US2010/043233, date of mailing Apr. 29, 2011, 9 p.

*Primary Examiner* — Ryan Lepisto
*Assistant Examiner* — Guy Anderson
(74) *Attorney, Agent, or Firm* — Hewlett-Packard Patent Department

(57) ABSTRACT

In an embodiment a first module can include a first side and a first edge. An optical transmitter connector can be a first distance from the first side at a first position along the first edge. An optical receiver connector can be a second distance from the first side wherein the first and the second distances are different and wherein the optical receiver connector is at a second position along the first edges. In an embodiment a chassis includes a first slot and a second slot with a first waveguide and a second waveguide.

15 Claims, 6 Drawing Sheets

(56) References Cited

U.S. PATENT DOCUMENTS

| | | | |
|---|---|---|---|
| 5,026,292 A | 6/1991 | Pickles et al. | |
| 5,373,109 A | 12/1994 | Argyrakis et al. | |
| 5,488,682 A * | 1/1996 | Sauter et al. | 385/53 |
| 5,530,287 A | 6/1996 | Currie et al. | |
| 5,673,346 A * | 9/1997 | Iwano et al. | 385/60 |
| 5,793,919 A * | 8/1998 | Payne et al. | 385/135 |
| 5,835,646 A * | 11/1998 | Yoshimura et al. | 385/14 |
| 5,893,761 A | 4/1999 | Longueville | |
| 5,963,681 A | 10/1999 | Clements | |
| 5,987,198 A | 11/1999 | Hirota et al. | |
| 6,335,869 B1 | 1/2002 | Branch et al. | |
| 6,440,770 B1 | 8/2002 | Banerjee et al. | |
| 6,473,300 B1 * | 10/2002 | Youngquist et al. | 361/679.33 |
| 6,621,950 B2 * | 9/2003 | Kato et al. | 385/24 |
| 6,654,515 B2 * | 11/2003 | Kato et al. | 385/24 |
| 6,952,744 B2 * | 10/2005 | Farnworth et al. | 710/13 |
| 7,094,095 B1 * | 8/2006 | Caveney | 439/540.1 |
| 7,142,748 B1 * | 11/2006 | Yang | 385/30 |
| 7,209,621 B2 * | 4/2007 | Glebov et al. | 385/129 |
| 7,220,130 B2 | 5/2007 | Spitler et al. | |
| 7,245,498 B2 * | 7/2007 | Togami et al. | 361/753 |
| 7,278,855 B2 | 10/2007 | Yasumura et al. | |
| 7,362,934 B2 | 4/2008 | Hamano | |
| 8,570,762 B2 * | 10/2013 | Rosenberg et al. | 361/775 |
| 2002/0021855 A1 * | 2/2002 | Kim | 385/15 |
| 2002/0065971 A1 | 5/2002 | Farnworth et al. | |
| 2004/0166905 A1 * | 8/2004 | Cherniski et al. | 455/575.1 |
| 2005/0047795 A1 * | 3/2005 | Windover et al. | 398/164 |
| 2005/0196106 A1 * | 9/2005 | Taira et al. | 385/78 |
| 2006/0045417 A1 * | 3/2006 | Morita | 385/31 |
| 2007/0092185 A1 * | 4/2007 | Sasaki | 385/89 |
| 2008/0002988 A1 * | 1/2008 | Cheng et al. | 398/182 |
| 2008/0095503 A1 | 4/2008 | Hasegawa et al. | |
| 2008/0166090 A1 | 7/2008 | Kiani et al. | |
| 2008/0186667 A1 * | 8/2008 | Verdiell et al. | 361/686 |
| 2008/0222351 A1 | 9/2008 | Verdiell et al. | |
| 2009/0097803 A1 * | 4/2009 | Yeo | 385/89 |
| 2009/0163043 A1 * | 6/2009 | Demers et al. | 439/43 |
| 2011/0280513 A1 * | 11/2011 | Morris et al. | 385/14 |
| 2011/0286691 A1 * | 11/2011 | Hopkins et al. | 385/14 |
| 2011/0293225 A1 * | 12/2011 | Daikuhara et al. | 385/89 |
| 2012/0027354 A1 * | 2/2012 | Katayama et al. | 385/54 |
| 2012/0039562 A1 * | 2/2012 | Tan et al. | 385/14 |
| 2012/0051688 A1 * | 3/2012 | Pitwon | 385/14 |
| 2012/0063725 A1 * | 3/2012 | Meadowcroft et al. | 385/88 |
| 2012/0195548 A1 * | 8/2012 | Brunner et al. | 385/18 |

FOREIGN PATENT DOCUMENTS

| | | |
|---|---|---|
| CN | 1886688 | 12/2006 |
| KR | 1020060067946 | 6/2006 |

* cited by examiner

SYSTEM INCLUDING A MODULE

BACKGROUND

A computing system may be a modular system. The system may include a processing module and a storage module for example. The modules can be installed in a chassis that provides communication channels and power to the modules. The chassis provides a communications channel between the modules and an also provide the modules with power. The channel between the modules may cause a module to wait before it can send data to another module.

BRIEF DESCRIPTION OF THE DRAWINGS

Some embodiments of the invention are described with respect to the following figures.

DETAILED DESCRIPTION

A computing system can include modules providing various functions or features. For example, the module may be a processing unit to process instructions and data, a storage unit that may include items such as nonvolatile memory or volatile memory, a communications unit that may connect the computing system to a network, or the module may provide a different function to the computing system. A processing unit for example may include a processor that needs to send data to another processing unit or to a storage unit. The connection between two modules may create a bottleneck where the inter-module data transfer rate exceeds the data processing or handling capabilities of the source module, destination module, or both the source and destination modules.

The connection between two modules may be limited by the frequency of the signal between the two modules and the propagation of the signal through an electrical conductor such as copper. An optical connection between the two modules may provide a higher transfer rate and more bandwidth compared to a similar connection through a copper conductor.

In some embodiments the copper conductor connecting two modules may be included in addition to an optical connector. Adding the optical connector to the back of a module can further reduce the airflow through the system and the reduced air flow may cause cooling problems for the system.

An optical connector may be placed on the to or the bottom of the module. An optical connector may have both a transmitter and a receiver. If a module is installed in a chassis the transmitter and receiver can be aligned so that the transmitter can transmit signals into optical communication path in the chassis and the receiver can receive signals from another optical communication path in the chassis. A first alignment device may be used for the transmitter and a second alignment device may be used for the receiver so that the transmitter and receiver in adjacent modules are properly aligned. The transmitter and receiver can be at different distances from the first side of the module and are located at a different position along the edge of the module. In one embodiment the positions of the transmitter and receiver may create a stair step pattern relative to the first side of he module.

Figure 1:
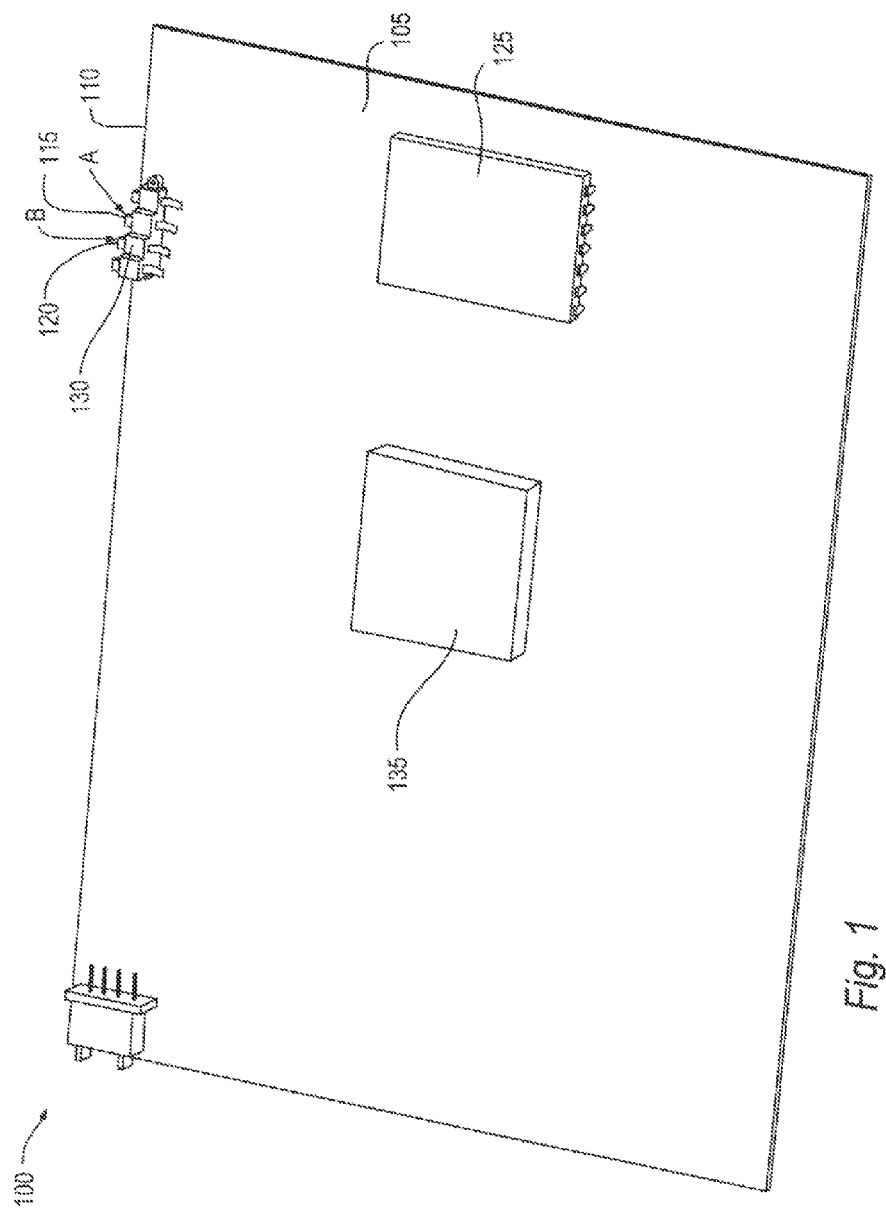
FIG. 1 is a module according to an example embodiment of the invention.

With reference to the figures, FIG. 1 is a module according to an example embodiment of the invention. The module 100 can communicate with another module of a computing system to add functionality to the computing system. For example the module may be to processor module to process data, instructions, or both, a storage module to store data, instructions or both, a communications module or another type of module. The module may be a printed circuit board with a component 135 or components attached to the printed circuit board. The printed circuit board may be within an enclosure forming all or a portion of the module.

The module 100 includes a first side 105. The module 100 includes first edge 110. An optical transmitter connector 115 can be a first distance from the fir side 105 at a first position A along the first edge 110. An optical receiver connector 120 can be a second distance from the first side where the first and the second distances are different. The optical receiver connector 120 can be at a second position B along the first edge 110.

The optical transmitter connector 115 and the optical receiver connector 120 can be connected to un optical chip 125. The optical chip 125 may create an optical signal that carries data received by the optical chip from for example another component. The optical chip 125 may receive optical signals carrying data and send that data to for example another component. The optical transmitter connector 115 and the optical receiver connector 120 may be optically connected to the optical chip 125. The optical chip 125 may transmit data from a processor, volatile storage such as random access memory, non-volatile storage such as a hard drive, a network connection or another data source. The optical chip 125 may receive data from another module.

The first position A along the first edge may be adjacent to the second position B. If the first position A and the second position B are adjacent then the optical transmitter connector 115 and the optical receiver connector 120 may he in a stair stepped pattern relative to the first side 105 and may be in a housing 130. The, optical transmitter connector 115 may be in the same or different housing as the optical receiver connector 120.

A second module may have the optical transmitter connector 115 and the optical receiver connector 120 in the same or different positions as the first module. If the optical transmitter and receiver connectors are in the same position for each module then the position of a first and second module would be interchangeable within a chassis. Where the optical transmitters and optical receivers are in different positions in the first and second modules, they can be configured by changing the connection between the optical chip 125, the optical transmitter connector 115, and the optical receiver connector 120. The position of the optical transmitter connector 115 and the optical receiver connector 120 can depend on the design of the first waveguide that connects the optical transmitter on the first module to the optical receiver on a second module and second waveguide that connects the optical receiver on the first module to the optical transmitter on the second module.

Figures 2, 4:
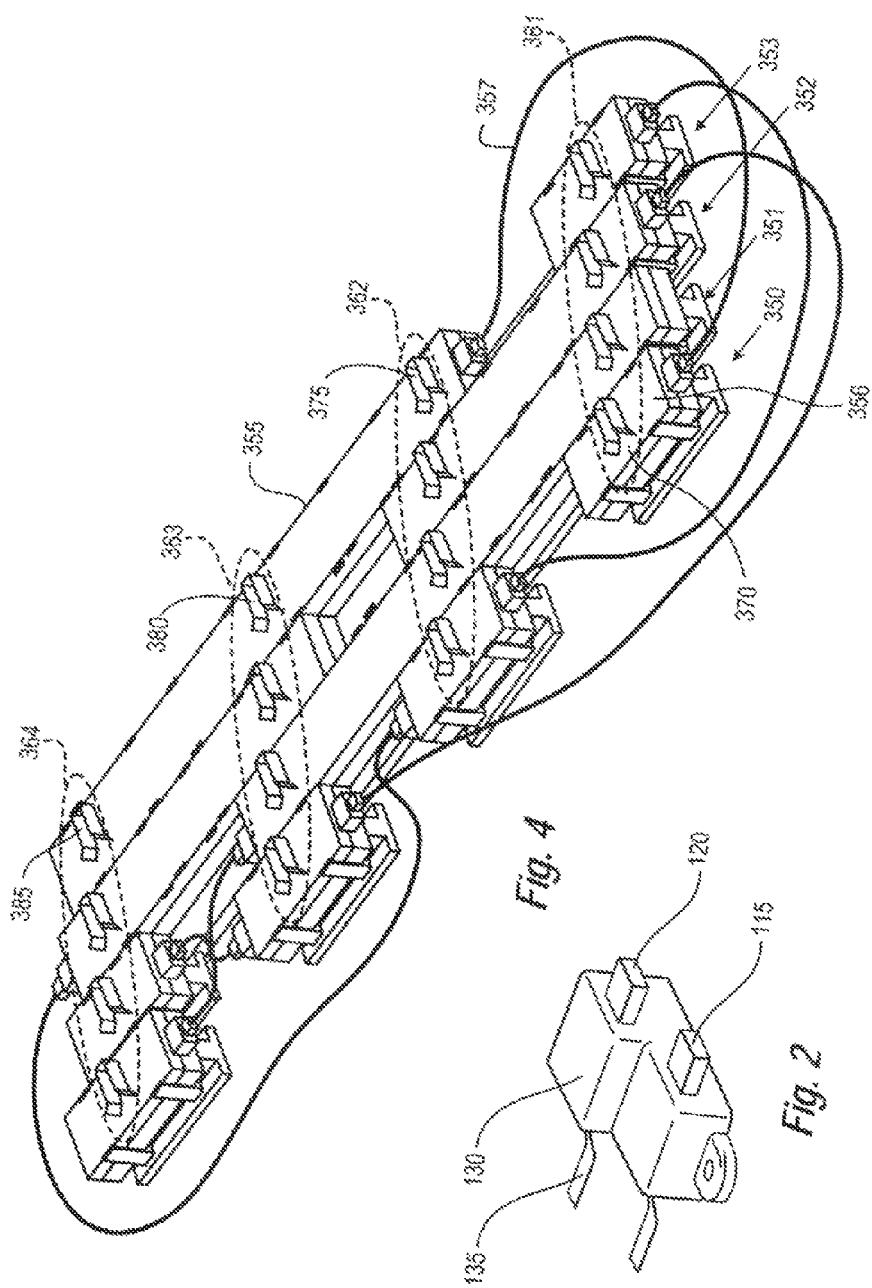
FIG. 2 is a connector according to an example embodiment of the invention.
FIG. 4 is a waveguide according to an example embodiment of the invention.

FIG. 2 is a connector according to an example embodiment of the invention. The connector may include a connector housing 130. The connector housing may include an optical transmitter connector 115, an optical receiver connector 120, or both. A resilient member can apply a force between the optical transmitter 115 or optical receiver 120 and a connector on a waveguide. For example the optical transmitter connector or optical receiver connector may be spring loaded to retract or apply force against a waveguide if a connection is made between the module and a waveguide. The optical transmitter or optical receiver connector may also be replaceable if the optical transmitter or optical receiver connector becomes damaged, worn out or is not compatible with the waveguide.

A connector may have multiple optical receiver connectors. For example a module may have one optical transmitter connector to transmit data to three other modules but have at least one receiver to receive data from the transmitters of each of the three other modules. The number of optical receivers a module includes can be the number of modules that the first module can connect to, for example if 4 modules communicated optically each module may have an optical transmitter and three optical receivers. A module may have more than one optical transmitters and more than one receiver per module it is communicating with to increase the bandwidth of the communication between the modules. An optical cable 135 can extend from the connector housing 130 to connect to an optical chip. There can be an optical cable for each of the connectors.

Figure 3:
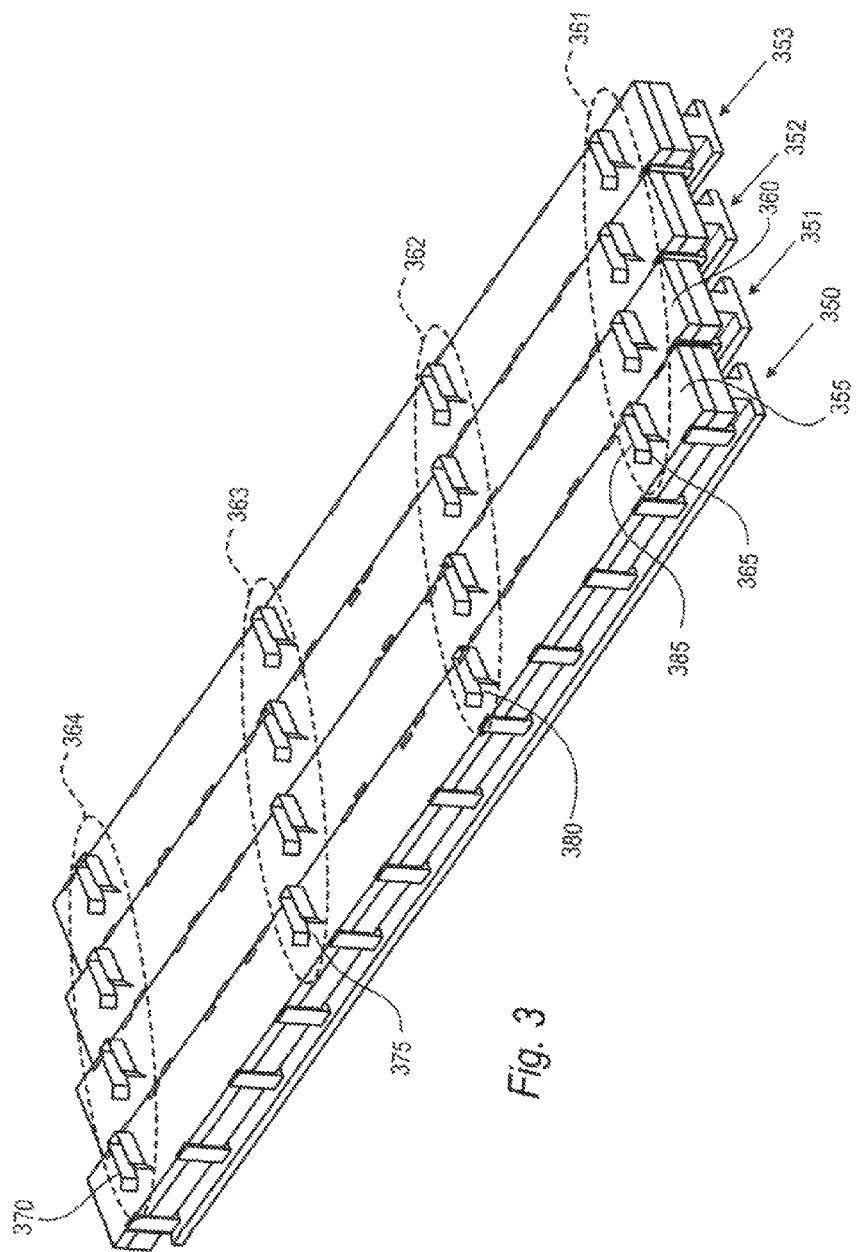
FIG. 3 is a waveguide according to an example embodiment of the invention.

FIG. 3 is a waveguide according to an example embodiment of the invention, The waveguide assembly may include a first waveguide a second waveguide 360, or more waveguides depending on the communications bandwidth required between interconnected modules. FIG. 3 shows four waveguides in the assembly, The first waveguide 355 may include a first connector 370, a second connector 375, a third connector 380 and a fourth connector 385, The connectors 370, 375, 380 and 385 can allow the exit of an optical signal from the waveguide receiver or permit the entry of an optical signal from a transmitter to the waveguide. The waveguide may have the same number of connectors as the number of modules that are connected to the waveguide, for example if the waveguide is connected to the optical transmitter or optical receiver of two modules then the waveguide may have two connectors. The connectors 370, 375, 380 and 385 can have an alignment guide 365 to align an optical transmitter or optical receiver with an opening in the waveguide. The alignment guide may be, for example, three walls with two walls on opposing sides of the connector and the third wall at one end of the connector, the opposite end of the two walls includes an opening for the optical transmitter or optical receiver to enter the alignment guide. The waveguide 355, 360 may be, for example, a hollow metal waveguide, an optical fiber, or another light transmitting material.

If a waveguide of FIG. 3 was installed in a chassis each of the modules that connect to the waveguides would have to be reconfigured so that the optical transmitter of one module was connected through the waveguide to the optical receivers of another module. If the optical transmitter connector of the first module was in the same position along the first edge of the first module as the position of the optical transmitter connector of the second module then a first module would be connected to the connectors in column 361 and second module would he connected to the connectors in column 362, and a third module would be connected to connectors in column 363 and a fourth module connected to the connectors column 364 with the optical transmitters connected to the connectors in row 350 and waveguide 355. Thus, the waveguide in row 350 would interconnect only optical transmitters and no receivers from the waveguides in row 351, 352 and 353 would be connected to these transmitters. If the waveguides in FIG. 3 were used in the chassis the optical transmitter in one of the modules would have to be moved to another position in the connector housing. For example, if there were only two modules then the optical transmitter connector 115 and the optical receiver connector 120 of FIG. 2 would have to be reversed. If the optical transmitter from the first module and optical receiver from the second module are connected by reversing the positions data can be transferred between the modules. If however, the optical transmitter of the first module and the optical transmitter of the second module were not reversed the first and the second modules could not communicate. The columns 361-364 and rows 350-353 of the wave may not be perpendicular to each other so that a connector from an optical transmitter or receiver does not have to pass over the connector in a different waveguide than the connector the connector was suppose to connect to.

FIG. 4 is a waveguide according to an example embodiment of invention. The waveguide can include a first waveguide 355 connected to a second waveguide 356 through a flexible waveguide 357 such as a fiber optic cable, Portions of the waveguides 355 and 356 are in different rows 350 and 353. Having the waveguides partially in different rows may allow the modules to be designed with the optical transmitters and the optical receivers in the same position on different modules. For example the row 350 may be connectors for optical transmitters and rows 351, 352. and 353 can be connectors for optical receivers. The connector 370 in row 350 may be a connector for an optical transmitter and the connectors 375, 380 and 385 in row 353 may be connectors for optical receivers while connectors 370, 375, 380 and 385 are in different columns 361, 362, 363. and 364.

Figure 5:
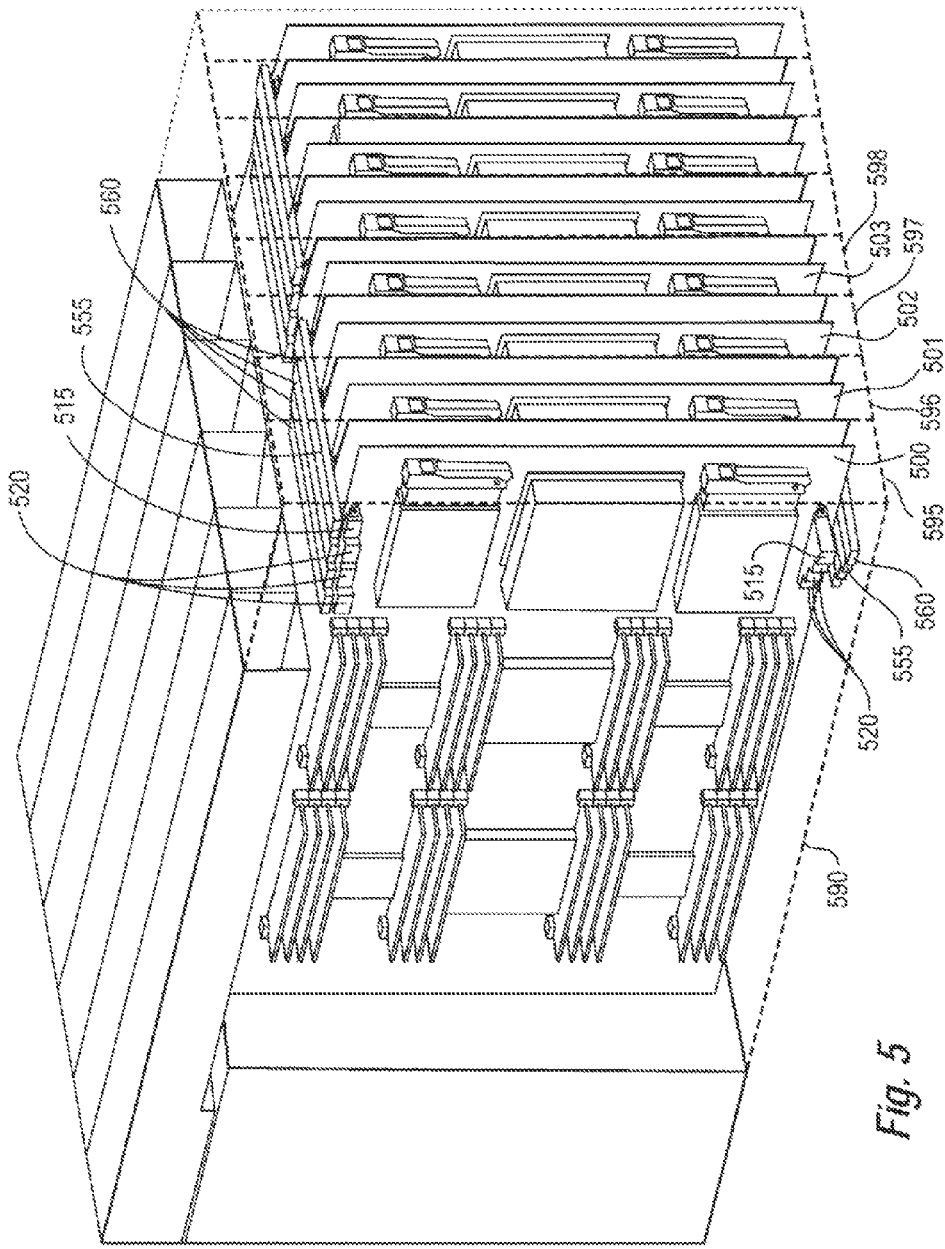
FIG. 5 is a chassis according to an example embodiment of the invention.
Figure 6:
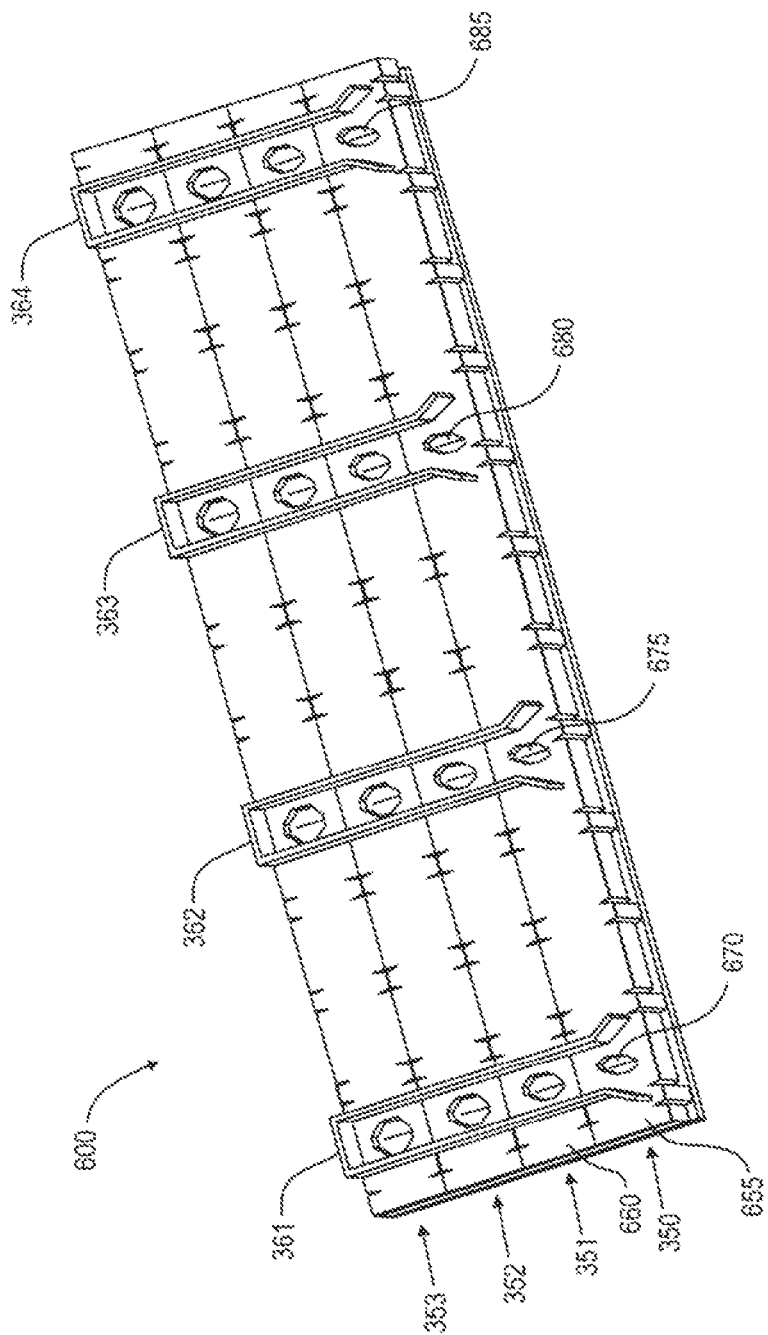
FIG. 6 is a waveguide according to an example embodiment of the invention.

FIG. 5 is a chassis according to an example embodiment of the invention, The chassis 590 can include for example a first slot 595 in the chassis to receive a first module 500 and a second slot 596 in the chassis to receive a second module 501. A first waveguide 555 with a first connector located a first distance from a side of the first slot 595 and at a first position along the side of the first slot; and a second waveguide 560 with a second connector located a second distance from the side of the first slot at a second position along the side of the first slot. The first connector on the first waveguide may be aligned with the optical transmitter 315 and the second connector on the second waveguide may be aligned with the optical receiver 520 of the first module 595. There may be multiple optical transmitters 515 and receivers 520 connected to each of the other modules 501, 502 and 503 through the waveguides 555 and 560 between the slots 595, 596. 597 and 598 to increase the bandwidth of data transmission between the first module and the second module, FIG. 6 is a waveguide 600 according to an example embodiment of the invention. The waveguide can include connectors 670. 675, 680, and 685 ire multiple columns 361, 362, 363, and 364, The connectors in each of the different rows 351, 352, 353 and 354 may have different shapes or sizes so that a connector for row 353 does not connect to the connector 670 in row 351 as the module is inserted in the chassis prior to being fully inserted in the chassis.

Figure 7:
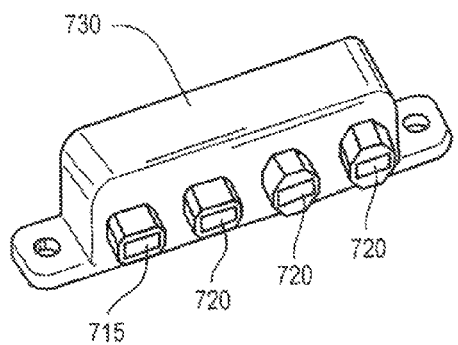
FIG. 7 is an optical connector according to an example embodiment of the invention.

FIG. 7 is an optical connector according to an example embodiment of the invention. The optical connector 730 includes optical transmitter connectors 715 and optical receiver connectors 720. The optical transmitter connector does not have to be the first connector in the connector and may be in any position on the optical connector 730, The connectors can be different sizes and different shapes to prevent the one of the connectors from connecting to one of the rows of the waveguide 600 before the connector is in the correct row to connect to the waveguide 600.

Figure 8:
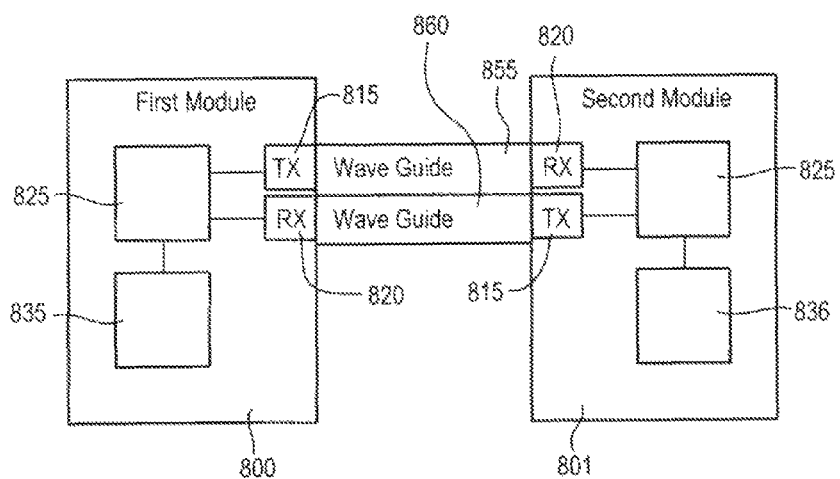
FIG. 8 is a block diagram according to an example embodiment of the invention.

FIG. 8 is a block diagram according to an ex example embodiment of the invention. The first module 800 can include a component 835 that is connected to an optical chip 825. The component 835 may be storage, a processor, an input output controller or another component. The optical chip 825 can be connected to the transmitter 815 and the receiver 820. The waveguide 855 can connect the optical transmitter 815 of the first component 800 to the optical receiver 820 of the second component 801. The waveguide 860 can connect the optical receiver 820 of the first module 800 to the optical transmitter 815 of the second module 801. The component 835 in the first module may be the same as component 836 in the second module or may be different components. For example if the first module 800 was a processor module the component 835 may be a processor and if the second module 801 was a storage module the component 836 may be a storage device such as a hard drive although the components 835 and 836 can be other components as well.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed:

1. A system comprising:
   a first module comprising a first portion to be inserted into a rear portion of a chassis slot, a second portion to be disposed at a front portion of the chassis slot after insertion of the first portion of the first module into the chassis slot, and a first side to extend between the first and second portions, wherein the first side has an associated first edge;
   an optical transmitter connector disposed a first distance from the first side at a first position along the first edge; and
   an optical receiver connector disposed a second distance other than the first distance from the first side,
   wherein the optical receiver connector is disposed at a second position other than the first position along the first edge.

2. The system of claim 1, wherein:
   the first module further comprises a substrate, a housing mounted to the substrate and plurality of connectors; and
   the optical transmitter and receiver connectors are adjacent connectors of the plurality of connectors.

3. The system of claim 1, further comprising a second module including a second side and a second edge; a second optical transmitter connector a first distance from the second side at a first position along the first edge; and
   a second optical receiver connector a second distance from the second side.

4. The system of claim 1, further comprising a chassis to receive the first module.

5. The system of claim 4, further comprising a waveguide in the chassis to align with the optical transmitter connector if the first module is received by the chassis.

6. The system of claim 5, wherein the waveguide aligns with a second optical receiver connector in a second module.

7. The system of claim 4, further comprising a waveguide in the chassis to align with the optical receiver connector if the first module is received by the chassis.

8. The system of claim 7, wherein the waveguide aligns with a second optical transmitter connector in a second module.

9. A system comprising:
   a chassis;
   a first slot in the chassis comprising a front portion, a rear portion and a side, the side extending between the front portion and the rear portion and the first slot to receive a first module inserted into the front portion of the first slot and moved along a depth dimension of the first slot toward the rear portion of the first slot;
   a first waveguide comprising a first connector located a first distance from the side of the first slot and located at a first depth of the first slot; and
   a second waveguide comprising a second connector located a second distance other than the first distance from the side of the first slot and located at a second depth other than the first depth of the first slot,
   wherein the first and second connectors optically couple to connectors of the first module in response to the first module being inserted into the first slot.

10. The system of claim 9, further comprising;
    a second slot to receive a second module,
    wherein:
      the first waveguide further comprises a third connector located a third distance other than the first and second distances from the side of the first slot; and
      the third connector optically couples to a connector of the second module in response to the second module being inserted into the second slot a third connector attached to the first waveguide located a first distance from the second wall and at a first position along the second wail.

11. The system of claim 10, wherein:
    the second waveguide further comprises a fourth connector located a fourth distance other than the first, second and third distances from the side of the first slot; and
    the fourth connector optically couples to another connector of the second module in response to the second module being inserted into the second slot.

12. The system of claim 9, further comprising a module comprising an optical transmitter to communicate with the first connector.

13. The system of claim 12, wherein the module comprising the optical transmitter further comprises an optical receiver to communicate with the second connector.

14. The system of claim 12, wherein the module comprising the optical transmitter further comprises a resilient member to apply force between the optical transmitter and the first connector.

15. A system comprising:
    a chassis comprising a first slot to receive a first module and a second slot to receive a second module, wherein:
      the first slot comprises a front portion and a rear portion and a side;
      the side extending between the front portion and the rear portion and the first slot to receive the first module in response to the first module being inserted into the front portion of the first slot and moved along a depth dimension of the first slot toward the rear portion of the first slot; and
    a plurality of waveguides mounted to the chassis and arranged in a plurality of rows, wherein the plurality of waveguides comprises:

a first waveguide being associated with a first row of the plurality of rows, the first waveguide including a first connector disposed at a first depth of the first slot to connect to an optical transmitter connector of the first module to optically couple the optical transmitter connector with an optical receiver connector of the second module; and a second waveguide being associated with a second row of the plurality of rows other than the first row, the second waveguide including a second connector disposed at a second depth of the first slot other than the first depth to connect to an optical receiver connector of the first module to optically couple the optical receiver connector with an optical transmitter connector of the second module.

* * * * *

UNITED STATES PATENT AND TRADEMARK OFFICE
CERTIFICATE OF CORRECTION

PATENT NO.        : 9,107,294 B2  Page 1 of 1
APPLICATION NO.   : 13/810665
DATED             : August 11, 2015
INVENTOR(S)       : Arlen L. Roesner et al.

It is certified that error appears in the above-identified patent and that said Letters Patent is hereby corrected as shown below:

In column 6, line 25, in Claim 10, delete "comprising;" and insert -- comprising: --, therefor.

In column 6, line 36, in Claim 10, delete "wail." and insert -- wall. --, therefor.

Signed and Sealed this
Seventh Day of June, 2016

Michelle K. Lee
*Director of the United States Patent and Trademark Office*